United States Patent

Kanai et al.

Patent Number: 4,538,473
Date of Patent: Sep. 3, 1985

[54] CROSS-ARM MECHANISM IN A PUSHBUTTON TUNER

[75] Inventors: Takao Kanai; Takao Chaki, both of Tokyo, Japan

[73] Assignee: Clarion Co., Ltd., Tokyo, Japan

[21] Appl. No.: 447,866

[22] Filed: Dec. 8, 1982

[30] Foreign Application Priority Data

Dec. 11, 1981 [JP] Japan ................... 56-198469

[51] Int. Cl.³ .................... F16H 35/18; H03J 5/06
[52] U.S. Cl. .............................. 74/10.33; 334/7
[58] Field of Search ................... 74/10.33; 334/7

[56] References Cited

U.S. PATENT DOCUMENTS

| 4,106,351 | 8/1978  | Santoro        | 74/10.33 |
| 4,189,949 | 2/1980  | Righi et al.   | 334/7 X  |
| 4,194,403 | 3/1980  | Santoro        | 334/7 X  |
| 4,205,557 | 6/1980  | Kantner        | 74/10.33 |
| 4,231,263 | 11/1980 | Antonello      | 74/10.33 |
| 4,248,102 | 2/1981  | Shimazu et al. | 74/10.33 |

FOREIGN PATENT DOCUMENTS 0065921  4/1982  Japan ........................ 334/7

Primary Examiner—Allan D. Herrmann
Assistant Examiner—Stephen B. Andrews
Attorney, Agent, or Firm—Flynn, Thiel, Boutell and Tanis

[57] ABSTRACT

A cross arm mechanism in a pushbutton tuner in which a setting plate is pivotally mounted on a cross arm, a plate spring with a support point nearer to the proximal end of the cross arm than the rotation center of the setting plate is mounted on the cross arm, the plate spring has a substantially C-shaped tightening portion which is opened toward the front end of the cross arm to press the setting plate from outside and fix it unmoved, right and left lever portions extend from both ends of the C-shaped tightening portion toward the proximal end of the cross arm, and a means for opening and closing the distance between the levers is provided at the tips of the levers.

3 Claims, 4 Drawing Figures

CROSS-ARM MECHANISM IN A PUSHBUTTON TUNER

BACKGROUND OF THE INVENTION

1. Field of the Invention

This invention relates to a cross arm mechanism in a pushbutton tuner.

2. Description of the Prior Art

In a pushbutton tuner, the pushbuttons in general are so arranged that a setting plate mounted on a cross arm is adequately changed in its fixture angle; the amount of movement of a memory slide caused by the setting plate is accordingly selected; and a core which is moved simultaneously with the memory slide is inserted to a given extent within a tuning coil, thereby selecting a desired frequency.

One of the present applicants already proposed a mechanism as shown in FIG. 1 as one of the measures for fixing a setting plate at a desired angle on a cross arm.

Namely, on a cross arm 1 is secured a setting pin 2 and the setting pin 2 pivotally supports a setting plate 3 which is engaged therewith. The setting plate 3 is arc-shaped at one end thereof nearer to the front end of the cross arm, and triangular at the other end thereof nearer to the proximal end of the cross arm 1, respectively. That is, it is drop-shaped as a whole. At the side edge of said other end of the setting plate 3 is formed an urging protuberance 4 for urging a memory slide.

A substantially U-shaped plate spring 5 is mounted on the cross arm 1 in a manner surrounding the setting plate 3. The plate spring 5 is fixed at the front end thereof to the front end of the cross arm 1. The two legs, right and left, of the U-shaped plate spring 5 extend toward the proximal end of the cross arm 1 in a manner grasping the setting plate 3 from right and left directions. Further, the plate spring 5 has a circular tightening portion 6 at the inner sides of the legs near the tip of the plate spring 5. The tightening portion 6 surrounds and contacts a front end portion of the setting plate 3 which is correspondingly configured in a circle.

A pushbutton 7 is coupled to the proximal end of the cross arm 1 and the proximal ends of the right and left legs of the plate spring 5. Fastening protuberances of the pushbutton 7, when the pushbutton 7 is fully engaged with the cross arm 1, inwardly urge the right and left legs to tighten the legs while when the pushbutton 7 is halfway pulled out of the cross arm 1, urging force by the fastening protuberances is released to thereby permit the right and left legs of the plate spring 5 to expand outward.

This cross arm mechanism functions as will be described hereunder.

To preset a frequency to be selected by a pushbutton, a tuning shaft associated with the pushbutton is previously rotated by hand to move the associated core which is moved simultaneously with rotation of the tuning shaft to a given extent within the associated tuning coil, thereby selecting a frequency to be set by the pushbutton. With this operation, a memory slide 8 which is movable simultaneously with the core moves longitudinally and reaches a position corresponding to the frequency to be selected. Thereafter, the pushbutton 7 which is coupled to the proximal ends of the cross arm 1 and the plate spring 5 is halfway pulled out of them to release fastening force against the plate spring 5. Then, the tightening portion 6 of the plate spring 5 expands outwardly and permits the front portion of the setting plate 3 to freely rotate about the setting pin 2.

When the pushbutton 7 and the cross arm 1 are pushed in the tuner, the urging protuberance 4 of the setting plate 3 gets in contact with a V-like cut-in 9 of the memory slide 8 is guided by a sloping edge of the V-like cut-in 9 to reach the summit of the same. In this case, since the position of the summit of the V-like cut-in 9 is determined by the position of the memory slide 8 which is corresponding to the position of the depth of the core within the tuning coil, the setting plate 3 rotates about the setting pin 2 so that the urging protuberance 4 reaches the summit of the V-like cut-in 9.

After the angle of the setting plate 3 is fixed to meet the summit of the V-like cut-in 9 of the memory slide 8, the pushbutton 7 at the proximal end of the cross arm 1 is further pushed in the tuner. At that time, since the cross arm 1 is prevented from advancing due to the memory slide 8, only the pushbutton 7 slides on the cross arm 1 to be thereby fully engaged with the cross arm 1. In this case, the proximal ends of the legs of the plate spring 5 are inwardly urged by the fastening protuberances 7a of the pushbutton 7 and are tightened narrower so as to strongly fasten the front portion of the setting plate 3. As the result, the setting plate 3 is fixed unmoved on the cross arm 1 with an angle corresponding to the position of the V-like cut-in 9 of the memory slide 8.

After that, the urging protuberance 4 of the setting plate 3 which was fixed on the cross arm 1 contacts and urged the cut-in 9 whenever the pushbutton 7 is pushed in the tuner to shift the memory slide 8 and insert the core which moves simultaneously with the memory slide 8 to the given extent within the coil.

PROBLEMS OF THE PRIOR ART

Said conventional mechanism is certainly advantageous in reducing the total thickness of the cross arm mechanism and accordingly reducing the size and thickness of the pushbutton tuner as compared to a mechanism so arranged to urge a setting plate from above with a spring in order to fix the setting plate because the former conventional mechanism is arranged so as to fix the setting plate with a horizontal urging force. However, said conventional mechanism has the following drawbacks when it is practically used in a pushbutton tuner.

Namely, since the setting plate 3 has to be rotatably mounted with respect to the dinner periphery of the plate spring 5 which is to fasten the setting plate 3, a slight gap is kept between the setting plate 3 and the plate spring 5. Additionally, a further gap is inevitable between them due to working preciseness of the setting plate 3 and the plate spring 5. Therefore, upon locking the setting plate 3, the gap W (FIG. 2) exists between the inner periphery of the plate spring 5 which moves simultaneously with the cross arm 1 and the tip of the setting plate 3 which is engaged in the V-like cut-in 9 of the memory slide 8. This gap W functions to pull the setting plate 3 toward the tip of the cross arm 1 (arrow A direction in the Figure) when the plate spring 5 fastens the setting plate 3.

More specifically, since in the mechanism in FIG. 1, the plate spring 5 which fastens the setting plate 3 is fixed at the tip thereof to the cross arm, inward force applied in order to narrow the distance between the right and left legs of the plate spring 3 to fasten the setting plate 3 is directed from the proximal end to the front end of the cross arm. Particularly when the summit of the V-like cut-in 9 is in a position laterally offset from the center of the cross arm 1 (the center of the setting plate 3) so that the setting plate 3 is pulled diagonally of the cross arm 1, said force functions as being a longitudinal component of force.

As the result, the setting plate 3 which was pulled by the longitudinal force component shifts the memory slide 8 longitudinally from the initial position of the same. Therefore, the memory slide 8 which has stopped at a position corresponding to a given frequency undesirably changes its position before the setting plate is locked. Due to this, the fixture angle of the setting plate 3 with respect to the cross arm 1 is also deviated, so that when the pushbutton is pushed in, a deviated frequency is selected.

OBJECT OF THE INVENTION

It is therefore an object of the present invention to overcome said draw-backs involved in the prior art. To this end, this invention provides a cross arm mechanism in a pushbutton tuner which never causes positional deviation of the memory slide due to force of the plate spring to pull the setting plate toward the cross arm upon fixture of the setting plate by the plate spring, thereby eliminating frequency deviation.

SUMMARY OF THE INVENTION

The construction of the cross arm mechanism according to the present invention is: the support point of the plate spring (the point whereat the plate spring is mounted on the cross arm) is located nearer to the proximal end of the cross arm than the position of the plate spring for fastening the setting plate. Thereby, when the setting plate is fastened and held unmoved by the plate spring, the fastening force is directed toward the proximal end of the cross arm to thereby avoid positional deviation of the memory slide due to the setting plate.

DETAILED DESCRIPTION OF THE PREFERRED EMBODIMENTS

Figure 1:
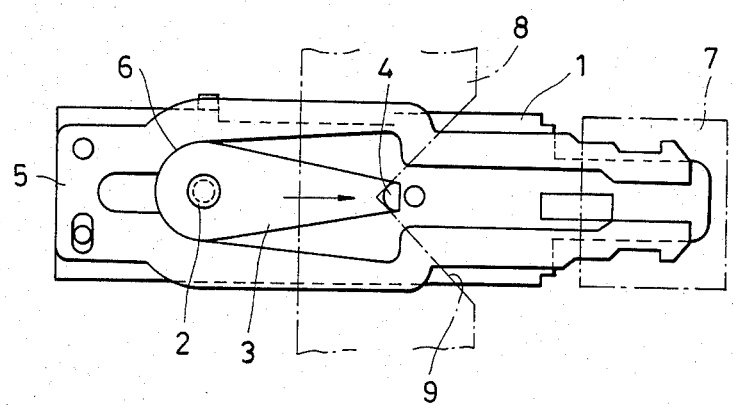
FIG. 1 is a plan view illustrating a cross arm mechanism in a pushbutton tuner which was formerly proposed by one of the present applicants.
Figure 2:
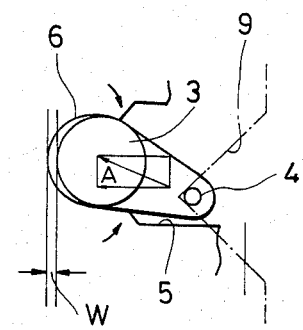
FIG. 2 is an enlargement plan view of said prior-art mechanism for explaining functions of the setting plate and the plate spring.
Figure 3:
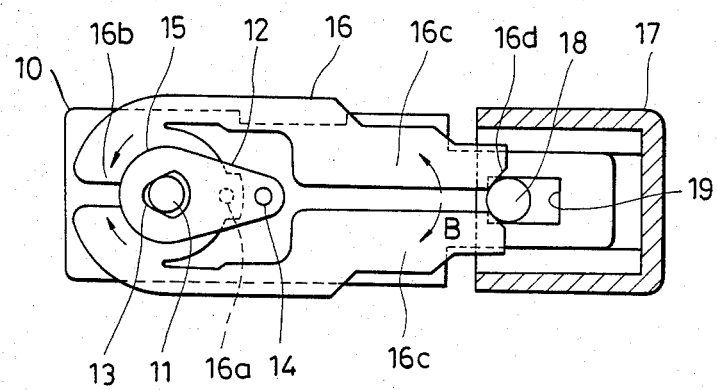
FIG. 3 is a plan view illustrating an embodiment of the cross arm mechanism according to the present invention.
Figure 4:
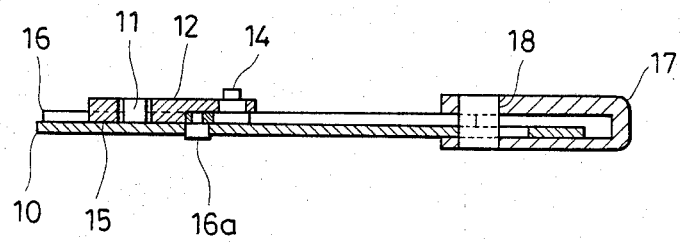
FIG. 4 is a longitudinal sectional view of FIG. 3.

The present invention will now be described in detail by way of the embodiment of FIGS. 3 and 4. In this embodiment, a setting pin 11 is secured at the front end of a cross arm 10 so as to extend upwardly therefrom. Around the setting pin 11 is pivotally mounted a setting plate 12. The setting plate 12 has a shaft bore 13 which is narrowed in V-like shape toward the front end of the cross arm 10, for example, so that the setting plate 12 is engaged with the setting pin 11 in such a manner that the slope of the shaft bore 13 contacts the outer periphery of the setting pin 11. The setting plate 12 is drop-shaped as a whole with one end thereof near the proximal end of the cross arm 10 being narrowed and has an urging protuberance 14 formed at the edge thereof near the proximal end of the cross arm for urging the memory slide. The setting plate 12 also has a downwardly extending cylindrical boss 15 concentric with the setting pin 11 and integrally formed on the lower surface of the tip portion of the setting plate 12.

On the cross arm 10 is mounted a plate spring 16. The plate spring 16 comprises a support point 16a for mounting itself on the cross arm 10, a tightening portion 16b located around the boss 15 of the setting plate 12 and right and left levers 16c for opening and closing the tightening portion 16b. The support point 16a is formed nearer to the proximal end of the cross arm 10 than the setting pin 11. The other portion of the plate spring 16 except the support point 16a is movable on the cross arm 10. The tightening portion 16b is substantially configured as a whole in letter C which is opened toward the tip of the cross arm 10 and the inner periphery of the tightening portion 16b contacts the outer periphery of the boss 15 of the setting plate 12. Further, the support point 16a is positioned at the center of the back surface of the C-shaped tightening portion 16b. The levers 16c extend from both sides of the C-shaped tightening portion 16b toward the proximal end of the cross arm 10. The levers 16c are engageable at the tips thereof with the pushbutton 17 coupled to the cross arm 10.

Inside the pushbutton 17 is formed locking protuberance 18 with a diameter wider than the distance between the levers 16c. The locking protuberance 18 faces the opening ends of the levers 16c so as to enter between the levers 16c from the opening end. The opening ends of the levers 16c are tapered so as to permit the locking protuberance 18 to smoothly enter in the slit.

At the proximal end of the cross arm 10 is formed a window 19 extending in the length direction of the cross arm 10. The locking protuberance 18 is movable in the window 19.

The cross arm mechanism according to this embodiment functions as will be described hereunder.

To preset a frequency to be selected at the pushbutton 17, for example, the pushbutton 17 is first halfway pulled out of the proximal end of the cross arm 10. Then, the locking protuberance 18 formed on the pushbutton 17 moves along the window 19 of the cross arm 10, and comes out of the space between the levers 16c of the plate spring 16. As the result, the setting plate 12 which was fixed by the plate spring 16 comes to be freely rotatable about the support axis 11.

When a manual tuning knob is rotated from that state to thereby shift the memory slide up to a position corresponding to the desired frequency and the pushbutton 17 is pushed in to thereby make the cross arm 10 advance, the urging protuberance 14 of the setting plate 12 moves along the slope of the V-like cut-in of the memory slide, and accordingly, the setting plate 12 rotates up to an angle to bring the urging protuberance 14 to the summit of the V-like cut-in.

When the pushbutton 17 is further pushed in after the urging protuberance 14 reached the summit of the V-like cut-in, only the pushbutton 17 advances because the cross arm 10 is prevented from advancing by the memory slide with which the cross arm 10 is engaged through the urging protuberance 14. Then, the locking protuberance 18 formed on the pushbutton 17 enters in the space between the levers 16c of the plate spring 16 and expands the levers 16c in arrow B direction in the Figure. Since the levers 16c are connected by the C-shaped tightening portion 16b which is fixed at the support point 16a formed on the back surface thereof, force to narrow the space between the levers 16c (arrow C in the Figure) is applied to the opening ends of the levers 16c, so that the setting plate 12 fastens and fixes the drum portion 15 unmoved with the inner wall thereof.

In this case, since the support point 16a of the tightening portion 16b is located nearer to the proximal end of the cross arm 10 than the support axis 11 of the setting plate 12, the drum portion 15 is applied with force directed from the front end to the proximal end of the cross arm 10. As the result, the shaft bore 13 of the setting plate 12 and the setting pin 11 get in engagement with each other, so that the center of the setting plate 12 meets with the setting pin 11.

As described in the above, in the mechanism according to this embodiment, there never occurs such force to pull the setting plate 12 toward the front end of the cross arm 10 upon tightening operation of the plate spring 16. Therefore, the memory slide which is engaged with the setting plate 12 never deviates in its position.

As a means for pivotally mounting the setting plate 12 on the cross arm 10, a lower part of the boss 15 of the setting plate 12 may be used as an axis as it is to be inserted in a shaft bore formed in the cross arm 10 instead of using the combination of the setting pin 11 and the shaft bore 13 to insert the setting pin 11. In this case, the shaft bore of the cross arm 10 may be narrowed in V-like configuration at the tip thereof like the shaft bore 13 used in the embodiment shown in the Figure.

Further, the support point 16a at which the plate spring 16 is fixed on the cross arm 10 may be plural. Namely, two support points 16a may be formed symmetrically about the center line of the cross arm 10.

Instead of providing the tapered portion 16d on the lever 16c of the plate spring 16, the locking protuberance 18 of the pushbutton 17 may be formed as being shapened toward the plate spring 16.

The boss 15 and the urging protuberance 14 of the setting plate 12 may be formed separately from the drop-shaped main body so as to be fixed to the same with a pin or other members, or may be formed integrally with the main body by die casting method, etc.

As described in the above, since said cross arm mechanism is so arranged that the support point of the plate spring is located nearer to the proximal end of the cross arm than the rotation center of the setting plate and the tightening portion for fixing the setting plate by urging it radially inwardly is configured in substantially C-like configuration which is opened toward the tip of the cross arm, the tightening force of the plate spring 16 is applied to the setting plate 12 from the direction of the front end of the cross arm 10. As the result, the setting plate 12 never undesirably moves the memory slide.

Therefore, according to the present invention, it is possible to eliminate such drawbacks that the position of the memory slide deviates upon locking the setting plate and that the core slide and the core which move simultaneously with the memory slide undesirably shift, thereby ensuring precise preset of a given frequency to a give pushbutton.

We claim:

1. A cross arm mechanism in a pushbutton tuner, comprising:
an elongated cross arm having a front end and a proximal end;
a setting plate disposed on top of and extending longitudinally with respect to said cross arm, a setting pin and a shaft bore located close to said front end of said cross arm, one of said setting pin and said shaft bore being provided on said setting plate and the other thereof being provided on said cross arm, said shaft bore having opposed walls which taper in a direction toward said front end of said cross arm so that said walls define a substantially V-shaped portion of said bore, said setting pin projecting into said shaft bore so that said setting plate is mounted for pivotal movement with respect to said cross arm and said setting pin is disposed between and is adapted to contact said opposed walls, said setting plate having an urging protuberance extending upwardly therefrom at the end thereof that is located toward said proximal end of said cross arm, said protuberance being adapted to engage a memory slide of the tuner;
a pushbutton mounted on said proximal end of said cross arm and supported for longitudinal movement thereon between inner and outer position, and a locking member provided within said pushbutton;
a plate spring having a substantially C-shaped tightening portion which opens toward said front end of said cross arm and a pair of elastically deflectable lever arms on opposite lateral sides of said tightening portion and extending therefrom in a direction longitudinally of said cross arm toward said pushbutton, said lever arms defining a slot therebetween and being adapted to be deflected away from each other to receive said locking member therebetween when said pushbutton is in said inner position, said C-shaped tightening portion partially surrounding a portion of said setting plate and being distortable into clamping engagement with said setting plate when said lever arms are deflected away from each other, said locking member being received between said lever arms when said pushbutton is in said inner position so that said C-shaped tightening portion is distorted into clamping engagement with said setting plate when said pushbutton is in said inner position, said locking member being disposed outwardly of said slot when said pushbutton is in said outer position so that said C-shaped tightening portion is in non-clamping engagement with said setting plate when said pushbutton is in said outer position;
and support means defining a support point for mounting said plate spring on said cross arm, said support point being located nearer to said proximal end of said cross arm than said setting pin.

2. A cross arm mechanism as claimed in claim 1 wherein said locking member has a width larger than the width of said slot and the outer ends of said lever arms define an outwardly flaring entrance to said slot.

3. A cross arm mechanism as claimed in claim 1 in which said setting pin is mounted on said cross arm and extends upwardly therefrom, said shaft bore is provided in said setting plate in vertical alignment with said setting pin, said plate spring is disposed between said cross arm and said setting plate, said setting plate has a downwardly extnding cylindrical boss extending through the central opening of said C-shaped tightening portion of said plate spring and said support point is located on the longitudinally opposite side of said C-shaped tightening portion from the front end of said cross arm.

* * * * *